United States Patent
Iwaki et al.

(10) Patent No.: US 6,870,264 B2
(45) Date of Patent: Mar. 22, 2005

(54) MULTI-LEVEL CIRCUIT SUBSTRATE, METHOD FOR MANUFACTURING SAME AND METHOD FOR ADJUSTING A CHARACTERISTIC IMPEDANCE THEREFOR

(75) Inventors: Hideki Iwaki, Osaka (JP); Yutaka Taguchi, Osaka (JP); Tetsuyoshi Ogura, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 44 days.

(21) Appl. No.: 09/994,683

(22) Filed: Nov. 28, 2001

(65) Prior Publication Data

US 2002/0034839 A1 Mar. 21, 2002

Related U.S. Application Data

(62) Division of application No. 09/417,662, filed on Oct. 14, 1999, now Pat. No. 6,392,164.

(30) Foreign Application Priority Data

Oct. 16, 1998 (JP) .......................................... P10-295132
Oct. 4, 1999 (JP) .......................................... P11-282505

(51) Int. Cl.$^7$ .............................................. H01L 23/48

(52) U.S. Cl. ...................... 257/758; 257/698; 257/700; 174/262

(58) Field of Search ................................ 257/678, 684, 257/687, 698, 700, 750, 758, 759, 756, 798; 174/262, 263, 264

(56) References Cited

U.S. PATENT DOCUMENTS

| | | | | | |
|---|---|---|---|---|---|
| 4,494,083 A | * | 1/1985 | Josefsson et al. | .............. | 333/33 |
| 5,039,965 A | * | 8/1991 | Higgins, Jr. | ................ | 333/182 |
| 5,406,235 A | * | 4/1995 | Hayashi | ...................... | 333/204 |
| 5,408,053 A | * | 4/1995 | Young | ......................... | 174/264 |
| 5,450,290 A | * | 9/1995 | Boyko et al. | ............... | 361/792 |
| 5,459,368 A | * | 10/1995 | Onishi et al. | ............... | 310/313 |
| 5,473,120 A | * | 12/1995 | Ito et al. | ..................... | 174/264 |
| 5,734,560 A | * | 3/1998 | Kamperman et al. | ....... | 361/774 |
| 5,830,301 A | * | 11/1998 | Sturzebecher et al. | ... | 156/89.16 |
| 5,835,357 A | * | 11/1998 | Swamy et al. | .............. | 361/764 |

FOREIGN PATENT DOCUMENTS

JP 5-206678 8/1993

* cited by examiner

Primary Examiner—Nathan J. Flynn
Assistant Examiner—Leonardo Andújar
(74) Attorney, Agent, or Firm—Jacobson Holman PLLC

(57) ABSTRACT

An insulator is provided between interconnect layers oppositely placed. The interconnect layers are connected between by connection members provided through the insulator. The connection members at one and the other ends are connected between in their center positions. A shield layer is provided spaced from the intermediate connection layer generally on a same plane as the intermediate connection layer. A condition of $(R \cdot r)/(2 \cdot h) \leq L \leq (5 \cdot R \cdot r)/h$ is satisfied, provided that a connection distance between the interconnect layers through the connection members and the intermediate connection layer is h, the connection members where considered generally as a circular cylinder have a diameter R, the intermediate connection layer where considered generally as circular has a diameter r, and a spaced distance between the intermediate connection layer and the shield layer is L. Thus, characteristic impedance is stabilized.

19 Claims, 10 Drawing Sheets

F I G. 2
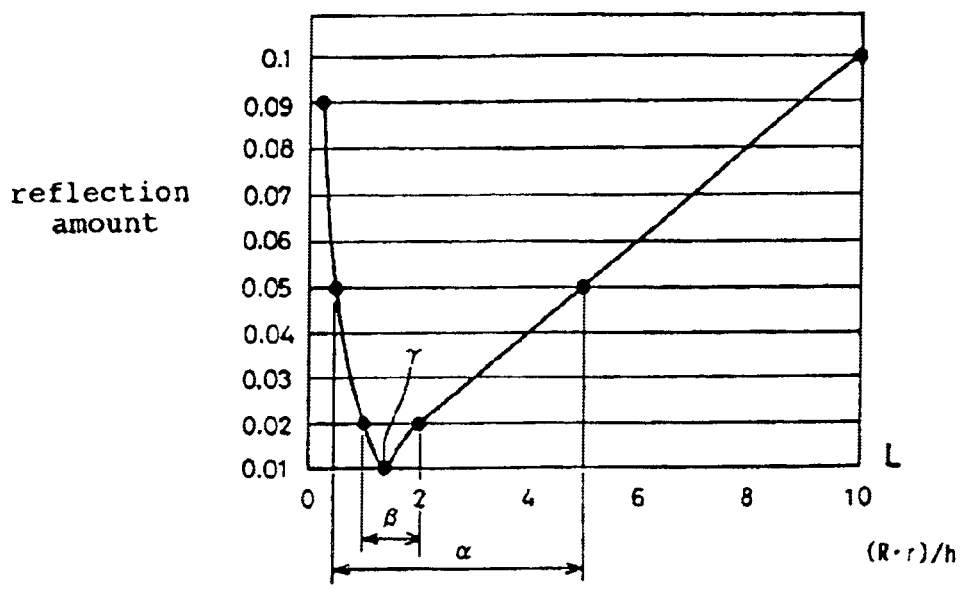
F I G. 3
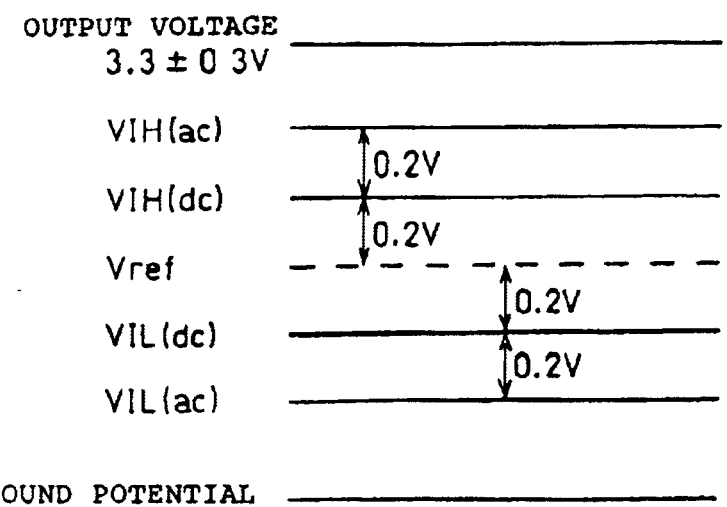

Γ = 0

10GHz

100MHz

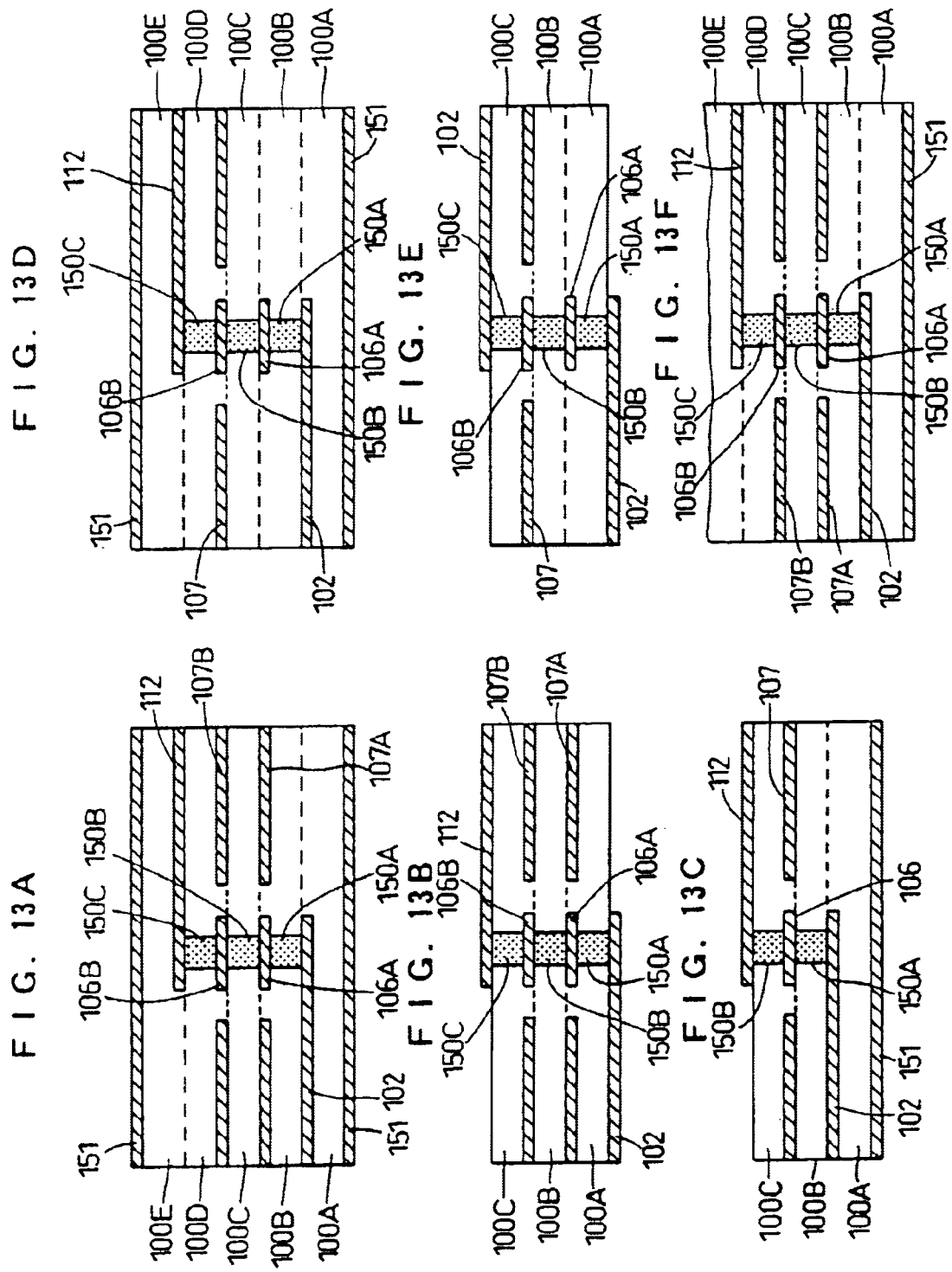

US 6,870,264 B2

MULTI-LEVEL CIRCUIT SUBSTRATE, METHOD FOR MANUFACTURING SAME AND METHOD FOR ADJUSTING A CHARACTERISTIC IMPEDANCE THEREFOR

This is a Divisional of application Ser. No. 09/417,662 filed Oct. 14, 1999 now U.S. Pat. No. 6,392,164.

BACKGROUND OF THE INVENTION

1. Field of the Invention

The present invention relates to a multi-level circuit substrate having interlayer connection through a conductor filled between layers thereof, a method for manufacturing same and a method for adjusting a characteristic impedance therefor.

2. Description of the Related Art

Recently there has been an increasing demand for implementing high density mounting of semiconductor devices with increase in the need to enhance operation speed and improve performances for the computers. In the high end field of super-computers, etc., the ceramic substrate utilized in semiconductor device mounting is structured by two interconnect layers sandwiched between ground layers (or power source layers). This have realized reduction of cross talk and control of characteristic impedance together with high density mounting. For data transfer utilizing a high clock frequency, however, the adoption of such a structure cannot provide for sufficient effects to reduce cross talk and control characteristic impedance.

Under such a situation, in conventional there has been a technology disclosed in a publication of Japanese Patent Laid-open No. 206678/1993. In this technology, five or more shield connection members are provided for a multi-level substrate having a shield connection member around a signal connection member thereof. Due to this, the reduction of cross talk and stabilization of characteristic impedance are achieved at around interlayer connecting portions. However, such a structure requires many connection members for the interconnect substrate. Thus, there is insufficiency in compatibility with today's high density mounting and increase in number of pins.

SUMMARY OF THE INVENTION

It is therefore an object of the present invention to provide, with high density and at low cost, signal-line connection members that are reduced in signal reflection due to a difference in characteristic impedance between the signal interconnect layer and the signal-line connection member, thereby realizing both characteristic impedance stability and high density mounting.

Another object of the invention is to reduce the size of a substrate structure required for characteristic impedance matching.

In order to achieve the objects, the present invention comprises: at least two interconnect layers oppositely placed to each other; an insulator provided between the interconnect layers; connection members provided penetrating through the insulator along an opposed direction of the interconnect layers and connecting between the interconnect layers; an intermediate connection layer sandwiched by the connection members at a center position of the connection members provided along the opposed direction of the interconnect layers and electrically connecting between one end and the other end of the connection members; a shield layer provided nearly on a same plane as the intermediate connection layer and placed spaced from around the intermediate connection layer; and wherein a condition of $(R \cdot r)/(2 \cdot h) \leq L \leq (5 \cdot R \cdot r)/h$ is satisfied, provided that a connection distance between the interconnect layers through the connection members and the intermediate connection layer is h, the connection members where considered generally as a circular cylinder has a diameter R, the intermediate connection layer where considered generally as circular has a diameter r, and a spaced distance between the intermediate connection layer and the shield layer is L.

The present invention, satisfied by this condition, can provide matching in characteristic impedance between the interconnect layers and the connection members to a degree of a signal reflectivity of less than 0.05.

BRIEF DESCRIPTION OF THE DRAWINGS

The other objects of the invention will be made apparent by understanding the embodiments to be explained hereunder and clearly shown by the appended claims. The many advantages not mentioned in the preset description will be remembered by a skilled person through practicing the invention.

FIG. 2 is a graph showing a relationship of a signal reflectivity and a gap L in the first embodiment;

FIG. 3 is a figure for explaining a threshold of a signal reflection amount;

FIG. 13A–FIG. 13F are sectional views respectively showing other example of multi-level circuit substrate to which the invention is to be applied.

DETAILED DESCRIPTION OF THE INVENTION

Now preferred embodiments of the present invention will be described with reference to the drawings.

Figure 1A:
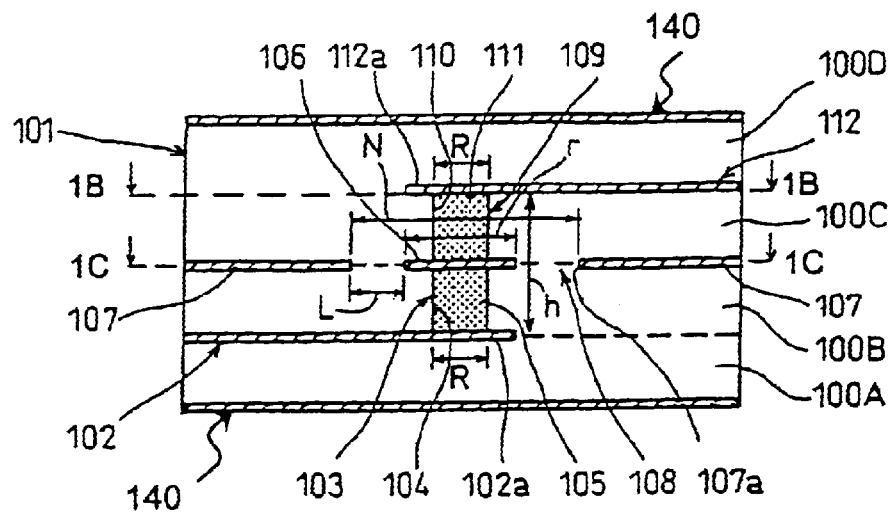
FIG. 1A is a sectional view showing a schematic structure of a multi-level circuit substrate according to a first preferred embodiment of the invention.
Figure 1B:
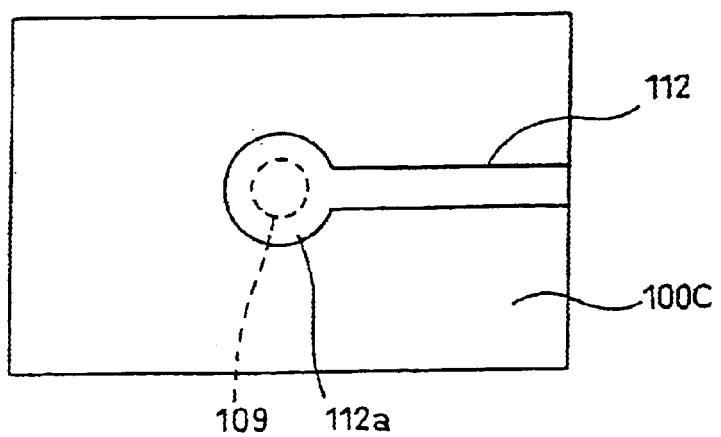
FIG. 1B is a sectional view taken on line 1B—1B of FIG. 1A.
Figure 1C:
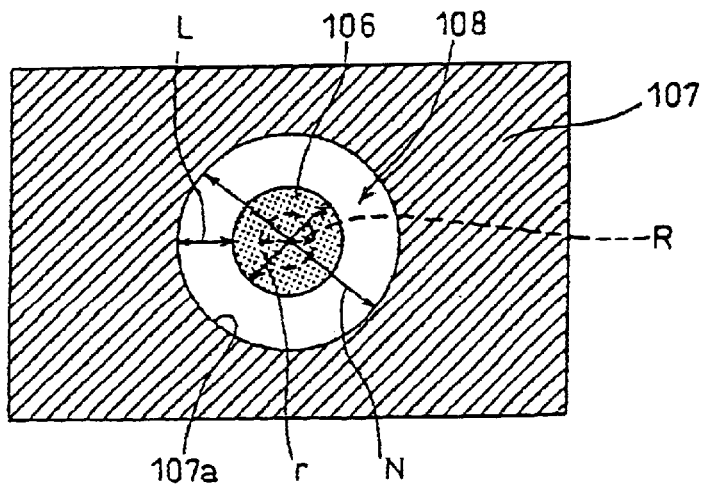
FIG. 1C is a sectional view taken on line 1C—1C of FIG. 1A.

FIG. 1 depicts a structure of a first preferred embodiment of the invention. This embodiment of the invention exemplifies a multi-level circuit substrate having four layers. It is however needless to say that the invention is also applicable to other number of layers than four layers of multi-level circuit substrates.

This multi-level circuit substrate includes a layered body 101 as an example of an insulator. The layered body 101 is structured by integrating four levels of insulation layers 100A, 100B, 100C and 100D. The insulation layer 100A as a lowermost layer of the layered body 101 has, on its top surface, an interconnect layer 102 as an example of a lower-level interconnect layer. The interconnect layer 102 is formed by a conductor film patterned in an interconnection form.

The insulation layer 100A has, at its top surface, an insulation layer 100B as an example of a lower-level insulation layer. The interconnect layer 102 is sandwiched between the insulation layer 100A and the insulation layer 100B. The insulation layer 100B is provided with a connection member 103 as an example of a lower-level connection member. The connection member 103 is formed by filling a conductor 105 in an nearly-circular connection hole 104 opened in a thickness direction through the insulation layer 100B.

The connection member 103 is placed on a connection land 102a provided with the interconnect layer 102. The connection member 103 at its lower end is abutted against the connection land 102a thereby electrically connected with the interconnect layer 102. The connection member 103 is, for example, formed of a conductor formed by filling a metal filler such as of copper, or an insulator such as an epoxy resin having a form equivalent to the connection hole 104 and a surface coated with a conductor by metal plating or the like.

The connection member 103 has a diameter R set somewhat greater than a diameter of the connection land 102a. This absorbs an error of alignment between the connection member 103 and the connection land 102a thus enhancing reliability of connection between them.

The insulation layer 100B has, at its top surface, a via land 106 as an example of an mid-level interconnect layer and a ground layer 107 as an example of a shield layer. The via land 106 and the ground layer 107 are each formed by a conductor film. The via land 106 is patterned generally circular in plan. The via land 106 is nearly concentrically provided at a top end of the connection member 103. The via land 106 is connected with the top end of the connection member 103 thereby electrically connected with the connection member 103. The via land 106 has a diameter r set somewhat greater than the diameter R of the connection member 103 (r>R). This absorbs an error of alignment between the via land 106 and the connection member 103 thus enhancing reliability of connection between them.

The ground layer 107 is provided encompassing around the via land 106. The ground layer 107 covers almost the top surface of the insulation layer 100B. The ground layer 107 is formed at inside with a circular cut-out 107a in order to avoid a forming region of the via land 106. The cut-out 107a is placed concentric to the via land 106. The cut-out 107a has a diameter N set greater than the diameter r of the via land 106 (N>r). By thus forming the ground layer 107, a ring-formed gap 108 having a width L is formed between the via land 106 and the ground layer 107. The gap 108 provides electrical insulation between the via land 106 and the ground layer 107.

Incidentally, in this embodiment the ground layer 107 was provided around the via land 106. It is however needless to say that in place of this a same form of a power source layer may be provided as a shield layer. Furthermore, it is needless to say that both ground and power source layers may be provided.

An insulation layer 100C is layered over a top surface of the insulation layer 100B. The via lad 106 and ground layer 107 are sandwiched between the insulation layers 100B and 100C. A connection member 109 as an example of an upper-level connection member is provided in the insulation layer 100B. The connection member 109 is formed by filling a connection hole 110 with a conductor 111.

The connection hole 110 is formed almost circular through the insulation layer 100C in a thickness direction thereof. The connection member 109 is placed on the via land 106. The connection member 109 at is lower end is joined to the via land 106, thereby electrically connected to the via land 106. The connection member 109 is arranged nearly concentric to and almost same in diameter R as the connection member 103. In order to provide the connection member 109 with a same electric characteristic as the connection member 103, a conductor 111 forming the connection member 109 is in a same material as the conductor 105 forming the connection member 103.

An interconnect layer 112 is provided as an example of an upper-level interconnect layer on a top surface of the insulation layer 100C. The interconnect layer 112 is formed by a conductor film patterned in an interconnection form. The interconnect layer 112 is formed integral with a connection land 112a. The connection land 112a is circular in plan. The connection land 112a is provided at a top end of the connection member 109 and almost concentric to the connection member 109. The connection land 112a is joined to the top end of the connection member 109 thereby electrically connected with the connection member 109. The connection land 112a has a diameter set somewhat greater than the diameter R of the connection member 109. This absorbs an error of alignment between the via land 106 and the connection member 103 thus enhancing reliability of connection between them.

As shown in FIG. 1, the distance of connection is given by h between the interconnect layer 102 and the interconnect layer 112 through the connection member 103, via land 106 and connection member 109.

An insulation layer 100D is layered on a top surface of the insulation layer 100C. The interconnect layer 112 is sandwiched between the insulation layer 100C and the insulation layer 100D.

In this embodiment a spacing 108 has a width that satisfies Equation (1) as follows. Due to this, the entire connection provided by the connection member 103 and connection member 109 has an impedance matched to a characteristic impedance of the interconnect layer 102 and interconnect layer 112.

$$(R \cdot r)/(2 \cdot h) \leq L \leq (5 \cdot R \cdot r)/h \tag{1}$$

where
R: the diameter of connection member 103, 109,
r: the diameter of via land 106
h: the connection distance between the interconnect layer 102 and the interconnect layer 112 through the connection member 103, via land 106 and connection member 109,
L: the width of the gap 108

Also, if within a range of the Equation (1) satisfying the following, the matching of characteristic impedance is preferably improved further with less signal reflection.

$$(R \cdot r)/h \leq L \leq (2 \cdot R \cdot r)/h \qquad (2)$$

Furthermore, of the range of Equation (1) a range satisfying the following is best preferred (best mode).

$$L = (1.5 \cdot R \cdot r)/h \qquad (3)$$

The reason of setting the above conditions will be explained hereinbelow.

Referring to FIG. 2, shown is a result of measurement on variation in amount of signal reflection caused between the connection member 103, 109 and the interconnect layer 102, 112 under a condition of sequentially changing the width L. The variation in amount of signal reflection is caused due to mismatch of characteristic impedance.

The measurement has been made under the condition that the width of the interconnect layers 102, 112 is 190 μm, the specific dielectric constant of the insulation layers 100A–100D is 3.5 and the connection distance h is 200 μm.

In FIG. 2, the value of width L standardized by (R·r)/h is given on the horizontal line while the amount of signal reflection is on the vertical axis.

As will be clear from FIG. 2, the amount of signal reflection is sufficiently low, i.e. as low as 0.05 or less within a range α that the width L satisfies the condition $(R \cdot r)/(2 \cdot h) \leq L \leq (5 \cdot R \cdot r)/h$.

The signal reflection amount further lowers to 0.02 or less within a range β that the width L satisfies the condition $(R \cdot r)/h \leq L \leq (2 \cdot R \cdot r)/h$.

The signal reflection amount assumes a minimum value 0.01 where the width L is on a point γ satisfying the condition $L = (1.5 \cdot R \cdot r)/h$.

For a system realizing data transfer using a clock frequency of 1 GHz or below, required is a reflection amount of 5% (=0.05) or less of an input signal. The reason of this is explained below with reference to FIG. 3.

Concerning I/O interfaces for a recent memory system using Dynamic RAM, the standards for RAMBUS (high-speed bus system proposed by U.S. RAMBUS Co., SSTL (Stub Series Terminated Transceiver Logic), etc. have been proposed and realized. For example, in SSTL_3 (Stub Series Terminated Logic for 3.3 Volts) of the Japanese Electronic and Mechanical Industrial standard, there are given an output voltage of 3.3±0.3 V as an output level standard, an input reference voltage Vref of 1.5±0.2 V, an input voltage high level minimum value V1H (dc) of input reference voltage Vref+0.2 V, and an input voltage low level maximum value V1L (dc) of input reference voltage Vref−0.2 V.

In order to meet a timing standard, the input signal usually satisfies a required input level V1H (ac), V1L (ac), i.e. an input reference voltage of Vref±0.4 V. A receiving end is logically established High for the input voltage high level minimum value V1H (dc) or higher. Similarly, Low determination is made for the input voltage high level minimum value V1H (dc) or lower. For other voltages, no establishment is made. Thus, no logical establishment is made.

Where the output voltage is 3.3 V, if the connection member 103, 109 has a signal reflection amount of 0.06, then a reflection signal has an amplitude of 0.216 V. If this reflection signal is introduced as input signal noise, a noise-added signal has a high level of an input signal reference signal of Vref+0.4±0.216 V. the noise-added signal has a low level of an input signal reference signal of Vref−0.4±0.216 V. If doing so, the noise-added input signal will have a high level minimum value and a low level maximum value of respectively of an input signal reference voltage of Vref+0.184 V and a input signal input reference voltage Vref−0.184 V. In this case, not met are an input reference voltage Vref+0.2 V as a minimum value V1H (dc) of an input voltage high level and an input reference voltage Vref−0.2 V as a maximum value V1L (dc) of an input voltage low level. That is, no logical establishment is made, resulting in malfunctioning. In this manner, for a reflection amount of 0.06 or higher a cause of malfunction results. In addition, because the input signal undergoes other noise effects than those of a reflection signal through the connection member 103, 109, there is need to reduce the reflection signal within the connection member. From such reasons, there is a necessity to reduce a signal reflection amount of 5% (0.05) or less.

For example, where setting a connection distance h 400 μm, a diameter R 200 μm and a diameter r 400 μm (hereinunder referred to as setting 1), then the followings are obtained:

$$(R \cdot r/2) \cdot h = 100$$

$$(5 \cdot R \cdot r)/h = 1000.$$

Accordingly, Equation (1) becomes as:

$$100 \leq L \leq 1000 \qquad (1)'$$

If in setting 1 the width L be 50 μm r 2 mm (=2000 m), then the condition of Equation (1)' is not satisfied. This will result in mismatch of characteristic impedance between the connection member 103, 109 and the interconnect layer 102, 112 thus raising a problem of increasing signal reflection between them.

In setting 1 the with L, if set at 100 μm, 400 μm or 1000 m, does not satisfy the condition of Equation (1)'. This provides characteristic impedance matched between the connection member 103, 109 and the interconnect layer 102, 112. Thus, almost no signal reflection occurs between them.

Meanwhile, the followings are provided:

$$(R \cdot r)/h = 200$$

$$(2 \cdot R \cdot r)/h = 400.$$

Accordingly, Equation (2) is given by:

$$200 \leq L \leq 400 \qquad (2)'$$

Consequenty, the width L in the setting 1 if set to such a value 200 μm or 400 μm as to satisfy the condition of Equation (2)' improves the matching of characteristic impedance between the connection member 103, 109 and the interconnect layer 102, 112. This reduces signal reflection at between them.

Furthermore, in setting 1 the following is provided:

$$(1.5 \cdot R \cdot r)/h = 300.$$

Accordingly, we obtain Equation (3) mentioned above as:

$$L=300 \quad (3)'$$

Consequently, the width L in the setting 1 if taken 300 μm as a value satisfying the condition of Equation (3)' provides a best match in characteristic impedance for the connection member 103, 109 and the interconnect layer 102, 112. Thus, the signal reflection between them are minimized.

Also, in the case of setting a connection distance h 200 μm, a diameter R 200 μm and a diameter r 300 μm (hereinunder referred to as setting 2), we obtain the followings:

$$(R \cdot r)/(2 \cdot h)=150$$

$$(5 \cdot R \cdot r)/h=1500.$$

Accordingly, Equation (1) becomes as:

$$150 \leq L \leq 1500 \quad (1)''$$

In setting 2 the width L, if set at 50 μm or 2 mm (=2000 μm), does not satisfy the condition of Equation (1)''. This will result in mismatch in characteristic impedance between the connection member 103, 109 and the interconnect layer 102, 112, raising a problem of increasing signal reflection at between them.

In setting 2, the width L, if set at 150 μm, 800 μm or 1500 μm, satisfies the condition of Equation (1)''. Accordingly, the characteristic impedance is matched between the connection member 103, 109 and the interconnect layer 102, 112. Thus, almost no signal reflection occurs between them.

Also, in this case we obtain the followings:

$$(R \cdot r)/h=300$$

$$(2 \cdot R \cdot r)/h=600.$$

Accordingly, Equation (2) becomes:

$$300 \leq L \leq 600 \quad (2)''$$

Consequently, if the width L in the setting 2 is set to such a value 300 μm or 600 μm as satisfying the condition of Equation (2)'', there is increase in matching of characteristic impedance between the connection member 103, 109 and the interconnect layer 102, 112, further reducing signal reflection between them.

Furthermore, in setting 2 the following is obtained:

$$(1.5 \cdot R \cdot r)/h=450.$$

Consequently, Equation (3) becomes:

$$L=450 \quad (3)''$$

Consequenty, in setting 2 if the width L is determined 450 μm as a value satisfying the condition of (3)'', the connection member 103, 109 and the interconnect layer 102, 112 are best matched in characteristic impedance. Thus, the signal reflection is minimized between them.

Figure 4A:
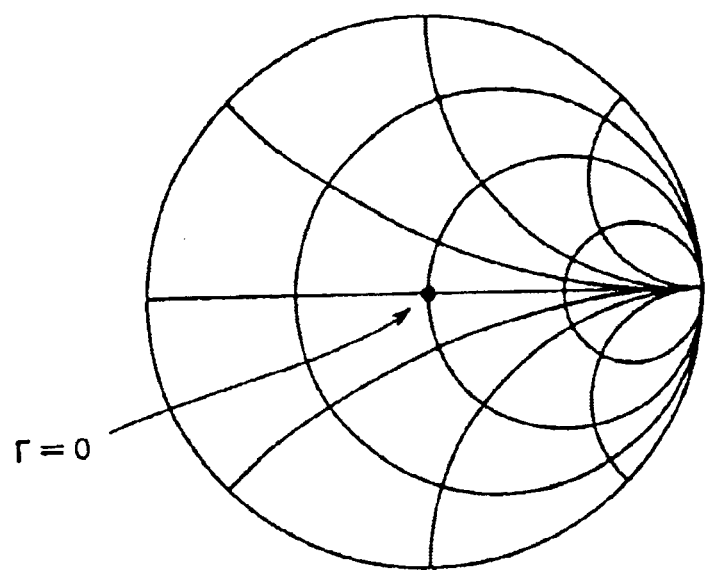
FIG. 4A is a Smith chart representative of a frequency characteristic of the multi-level circuit substrate of FIG. 1A–FIG. 1C.

FIG. 4A shows a result of measurement on a frequency characteristic (Smith chart) for characteristic impedance of the connection member 103, 109 satisfying Equation (3).

Figure 4B:
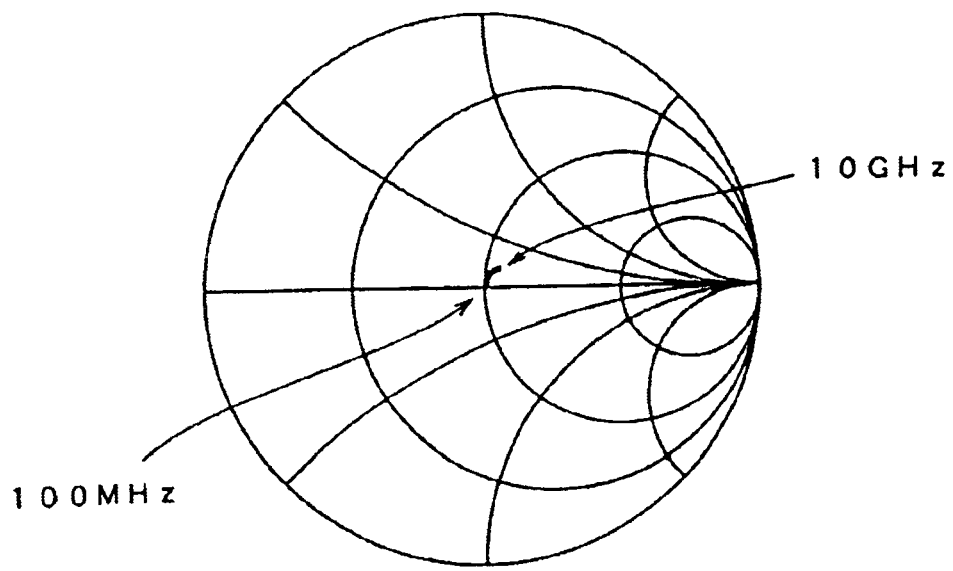
FIG. 4B is a Smith chart representative of a frequency characteristic of a related art multi-level circuit substrate.

Also. FIG. 4B shows a result of measurement on a frequency characteristic (Smith chart) for characteristic impedance of a structure fallen out of the scope of the invention (width L of 1000 μm=1 mm).

The measurements were made under the condition that the connection distance h is 400 μm, the diameter R 200 μm, the diameter r 400 μm, the width 190 μm and the specific dielectric constant of the insulation layers 100A–100D 3.5.

FIG. 4A and FIG. 4B show S11 of an S parameter on the connection member 103, 109 for signals having frequencies of from 100 MHz to 10 GHz.

The Smith chart is generally used to represent a characteristic of a device for a high frequency circuit, e.g. an RF filter or amplifier circuit in the field of radio communications. The use of a Smith chart makes possible immediate reading of a circuit impedance or reflection coefficient.

In S parameters, S11 as one of the S parameters is used to represent a reflection coefficient in a 2-port circuit describing for a traveling wave and reflection wave to and from a port 1 when a port 2 is matched to. On the Smith chart, the distance from a center to a plot point represents an absolute value of a reflection coefficient. The angle of rotation represents a phase angle of a reflection coefficient. Where plotting is at the center of the Smith chart, the reflection coefficient equals 0. Were plotting is on an outer peripheral circle, the reflection coefficient absolute value is 1. The relationship between impedance and reflection coefficient is given by the following provided that a circuit impedance is ZL, a signal source impedance Z0 and a reflection coefficient Γ:

$$\Gamma=(ZL-Z0)/(ZL+Z0).$$

In the case that the circuit impedance is completely matched to the signal source impedance (ZL=Z0), the reflection coefficient Γ=0 results. When plotting of characteristic is made on the center of the Smith chart, a circuit under consideration has an impedance matched to an impedance to be connected thereto. This means that reflection is eliminated.

For the structure of the invention, as shown in FIG. 4A plotting is made on a frequency characteristic in a manner gathering around the center of the Smith chart. The refection coefficient is nearly 0. The characteristic impedance on the connection member 103, 109 is nearly matched to the characteristic impedance of the interconnect layer 102, 112.

For a structure out of the scope of the invention, as show in FIG. 4B plotting at 100 MHz is on the center of the Smith chart. However, as the frequency increases, plot points moves distant from the center. At 10 GHz the distance is greatest from the center. The reflection coefficient absolute value at 10 GHz is approximately 5%.

As described above, it is possible for the present embodiment to provide characteristic impedance matching without requiring to form extra connection members. Consequently, the embodiment can form signal connection members with a twice density per unit area as compared to the conventional structure having five or more ground connection members per one signal connection member. Thus, in this embodiment size reduction is feasible as compared to the conventional. Further, it is possible to fabricate a multi-level circuit substrate at low cost.

Figure 5A:
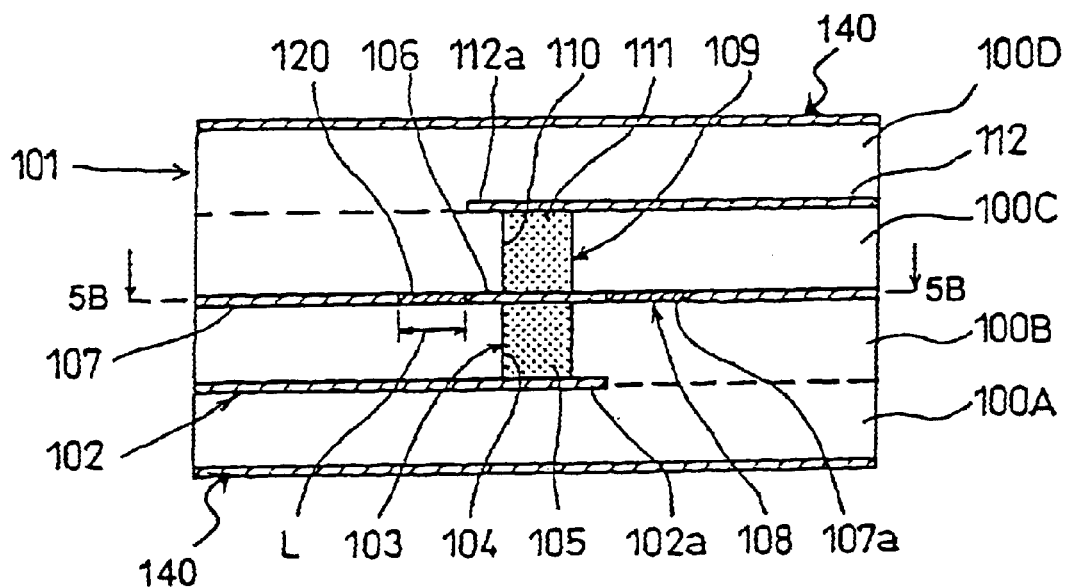
FIG. 5A is a sectional view showing a schematic structure of a multi-level circuit substrate according to a second preferred embodiment of the invention.
Figure 5B:
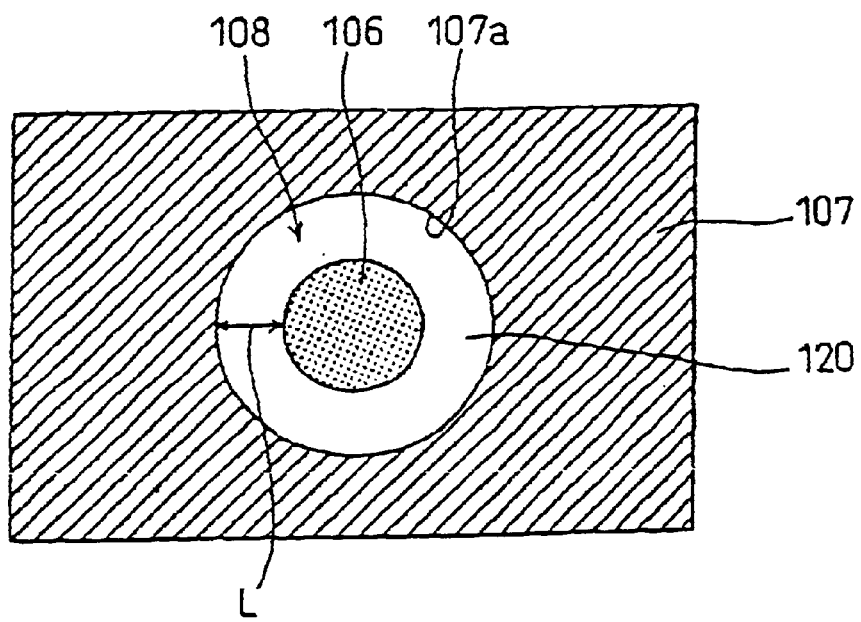
FIG. 5B is a sectional view taken on line 5B—5B of FIG. 5A.

Now a second referred embodiment of the invention will be described with reference to FIG. 5.

This multi-level circuit substrate has a similar schematic structure to that of the first preferred embodiment explained with FIG. 1. Accordingly, the same or similar parts are attached by the same reference characters as those of FIG. 1.

This multi-level circuit substrate includes a layered body 101 as an example of a first insulator. The layered body 101 is structured by integrating four levels of insulation layers 100A, 100B, 100C and 100D. The layered body 101 is provided at inside with an interconnect layer 102 and interconnect layer 112. These interconnect layers 102, 112 are electrically connected with each other through a connection member 103, via land 106 and connection member 109. The layered body 101 is internally formed with a ground layer 107 on the same plane as the via land 106. A gap 108 is formed between the ground layer 107 and the via land 106 for providing electrical insulation between them.

In the gap 108 is provided an insulator 120 as one example of a second insulator. The insulator 120 has a specific dielectric constant lower than that of the insulation layers 100A–100D. The insulator 120 fills the entire portion of the gap 108. The insulator 120 is formed, for example, as follows.

Figure 6A:
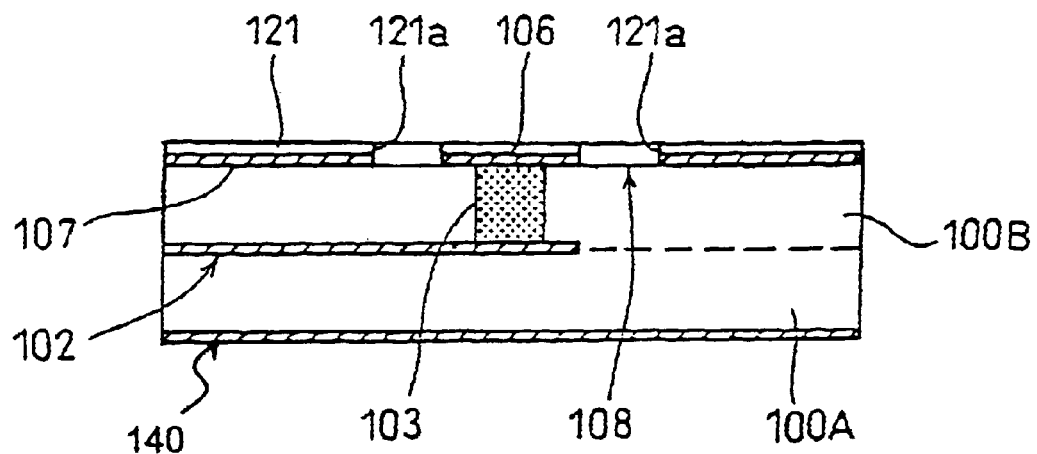
FIG. 6A–FIG. 6C are sectional views respectively showing manufacturing processes for the multi-level circuit substrates of FIG. 5A and FIG. 5B.

As shown in FIG. 6A, a via land 106, ground layer 107 and gap 108 are formed by patterning on the insulation layer 100B. Then, a resist pattern 121 as one example of a coat layer is formed on the insulation layer 100B. An opening 121a is formed in the resist layer 121 at a portion opposed to a gap 108.

Figure 6B:
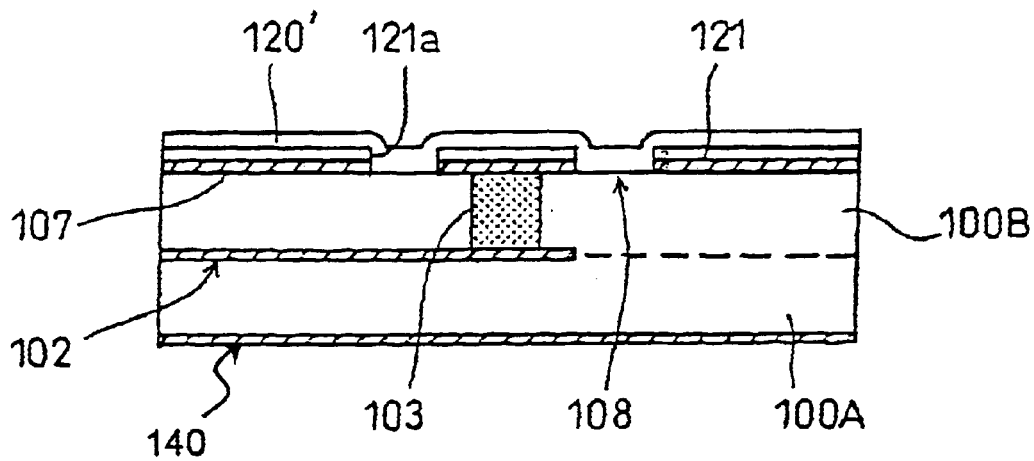
Figure 6C:
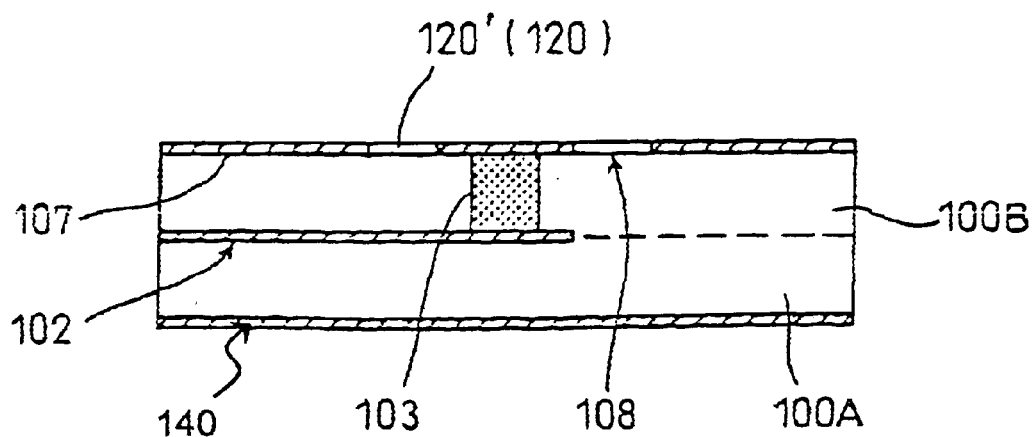

As shown in FIG. 6B, an insulation film 120' is formed of an epoxy resin or the like on the formed resist pattern 121. The insulation film 120' uses a material having a lower specific dielectric constant than that of the insulation layers 100A–100D. Then, as show in FIG. 6C the resist pattern 121 is removed to leave the insulation film 120' only at the gap 108.

The specific dielectric constant of the insulator 120 is closely elated to matching of characteristic impedance between the connection members 103, 109 and the via lad 106. This is because the specific dielectric constant of the gap 108 involves in the amount of a capacitance component caused between the via land 106 and the ground layer 107. Comparing a case that the gap 108 has an insulator having a lower specific dielectric constant than that of the insulation layers 100A–100D with a case of not doing so, the amount of generating a capacitance component is less for the case arranged with the insulator. For this reason, the width L required to obtain a matching of characteristic impedance between the connection member 103, 109 and the via land 106 is smaller for the case arranged with the insulator 120 in the gap 108 than the case of not doing so.

Accordingly, in this embodiment it is possible to decrease the width L required to match the characteristic impedance between the connection members 103, 109 and the via land 106. Due to this, this embodiment can reduce the size of the overall structure of the connection members 103, 109 as compared to a structure having a gap 108 not separately filled by an insulator.

Figure 7A:
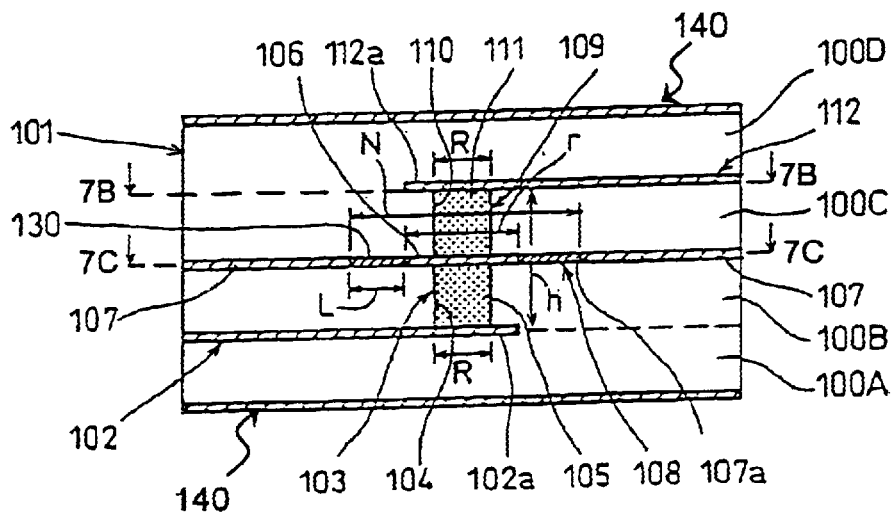
FIG. 7A is a sectional view showing a schematic structure of a multi-level circuit substrate according to a third preferred embodiment of the invention.
Figure 7B:
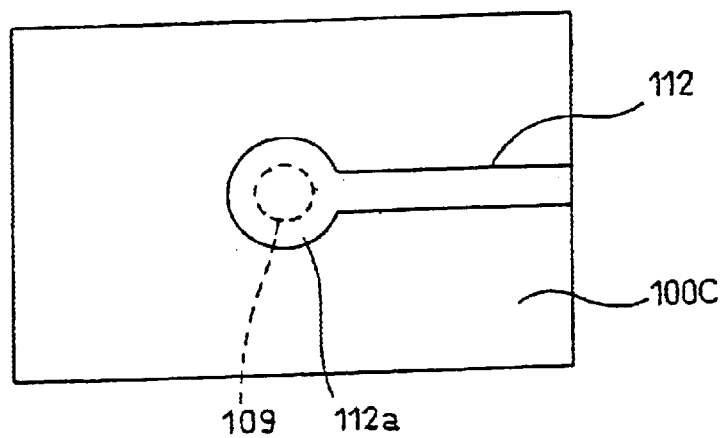
FIG. 7B is a sectional view taken on line 7B—7B of FIG. 7A.
Figure 7C:
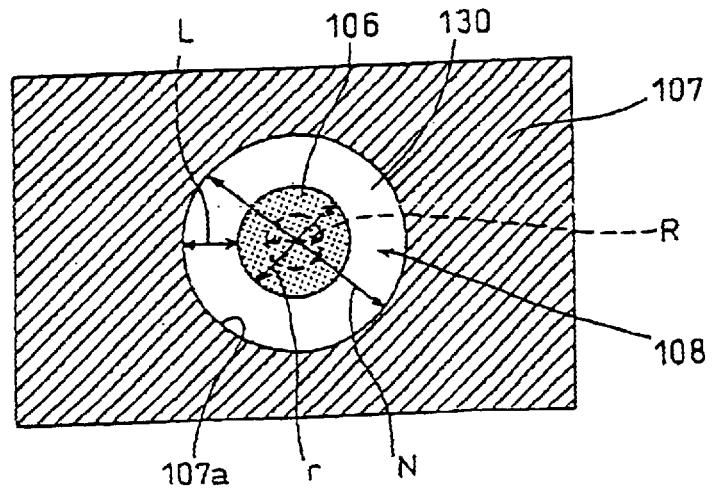
FIG. 7C is a sectional view taken on line 7C—7C of FIG. 7A.

Now a third preferred embodiment of the invention will be described with reference to FIG. 7.

This embodiment is basically similar to the structure of the first and second embodiments, and accordingly the same or similar parts are attached by the same reference-characters.

This multi-level circuit substrate is provided with a layered body 101 formed by integrating four levels of insulation layers 100A, 100B, 100C and 100D. The layered body 101 is provided at inside with an interconnect layer 102 and an interconnect layer 112. The interconnect layers 102, 112 are electrically connected with each other through a connection member 103, via land 106 and connection member 109. The layered body 101 is internally provided with a ground layer 107 on the same plane as the via land 106. A gap 108 is provided between the ground layer 107 and the via land 106, for providing electrical connection between them. The gap 108 is filled by an insulator 130 having a lower specific dielectric constant than that of the insulation layers 100A–100D.

In this embodiment, the width L satisfies the condition of Equation (4) given below. Due to this, the characteristic impedance of the overall connection member is matched to the characteristic impedance of the interconnect layers 102, 112.

$$(R \cdot r \cdot \sqrt{\in'})/(2 \cdot h \cdot \sqrt{\in}) \leq L \leq (5 \cdot R \cdot r \cdot \sqrt{\in'})/(h \cdot \sqrt{\in}) \quad (4)$$

where

R: diameter of the connection member 103, 109 r: diameter of the via land 106 h: connection distance between the interconnect layers 102, 112 through the connection members 103, 106 and connection member 109

L: width of the gap 108

$\in$: specific dielectric constant of the insulation layers 100A–100D

$\in'$: specific dielectric constant of the insulator 130

Meanwhile, if within a range of the above Equation (4) satisfying the following:

$$(R \cdot r \cdot \sqrt{\in'})/(h \cdot \sqrt{\in}) \leq L \leq (2 \cdot R \cdot r \cdot \sqrt{\in'})/(h \cdot \sqrt{\in}) \quad (5),$$

then the matching of characteristic impedance is preferably improved and signal reflection less occurs.

Furthermore, of the range of Equation (4) as above, the case satisfying the following is best preferred (best mode):

$$L = (1.5 \cdot R \cdot r \cdot \sqrt{\in'})/(h \cdot \sqrt{\in}) \quad (6).$$

The reason of setting the above condition is explained below.

Figure 8:
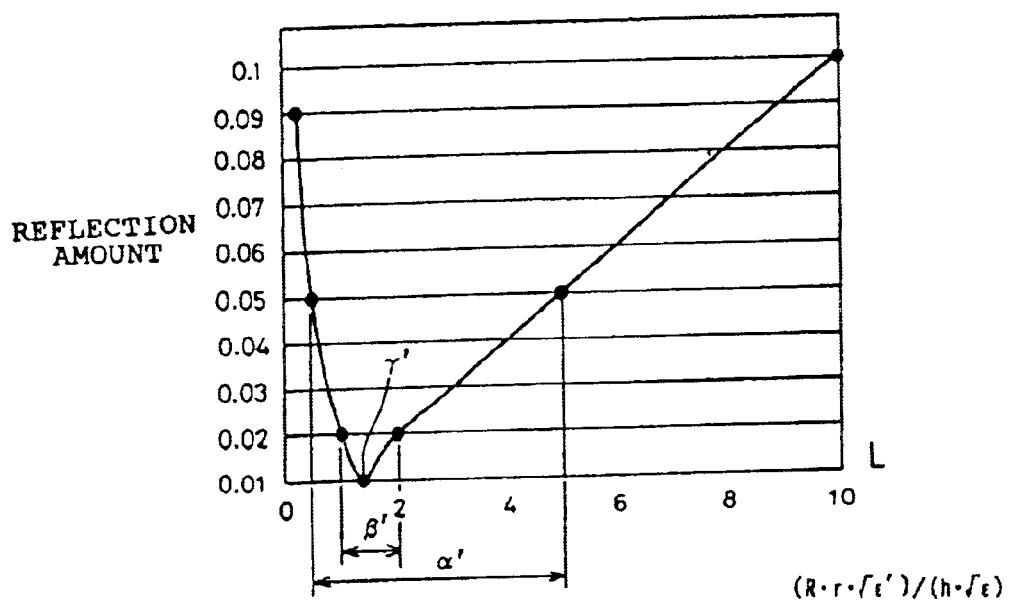
FIG. 8 is a graph showing a relationship of a signal reflectivity and a gap L in the third embodiment; third preferred embodiment of the invention.

Referring to FIG. 8, shown is a result of measurement on variation in amount of signal reflection caused between the connection member 103, 109 and the interconnect layer 102, 112 under a condition of sequentially changing the width L of the gap 108. This measurement was made under a condition that the line width for the interconnect layer 102, 112 is 190 μm, the specific dielectric constant for the insulation layers 100A–100D is 4.5, the specific dielectric constant $\in'$ for the insulator 130 is 3 and the connection distance h is 200 μm. Furthermore, in FIG. 8 the width L of the gap 108 is standardized by $(R \cdot r \cdot \sqrt{\in'})/(h \cdot \sqrt{\in})$. In FIG. 8 the value of the width L is taken on the horizontal axis while the amount of signal reflection is on the vertical axis.

Where the width L is within a range α' satisfying the condition $(R \cdot r \cdot \sqrt{\in'})/(2 \cdot h \cdot \sqrt{\in}) \leq L \leq (5 \cdot R \cdot r \cdot \sqrt{\in'})/(h \cdot \sqrt{\in})$, then the signal reflection is sufficiently low in value, i.e. 0.05 or less. As explained in the first preferred embodiment, a system for realizing data transfer using a clock frequency of 1 GHz or below requires to reduce the amount of signal reflection to 5% (=0.05) or less of an input signal.

Where the width L is within a range β' satisfying the condition $(R \cdot r \cdot \sqrt{\in'})/(h \cdot \sqrt{\in}) \leq L \leq (2 \cdot R \cdot r \cdot \sqrt{\in'})/(h \cdot \sqrt{\in})$, the signal reflection amount is further decreased to a low value, i.e. 0.02 or less.

Where the width L comes to a point γ' satisfying $L = (1.5 \cdot R \cdot r \cdot \sqrt{\in'})/(h \cdot \sqrt{\in})$, the signal reflection amount becomes a minimum value of 0.01.

For example, where the connection distance h is set at 400 μm, the diameter R of the connection member 103, 109 is 200 μm, the diameter r of the via land 106 is 400 μm, the specific dielectric constant $\in$ for the insulation layers 100A–100D is 4.5, and the specific dielectric constant $\in'$ for the insulator 130 is 3 (hereinunder referred to as setting 3), then we obtain the following:

$$(R \cdot r\sqrt{\in'})/(2 \cdot h \cdot \sqrt{\in}) \approx 82$$

$$5 \cdot R \cdot r\sqrt{\in'}/h \cdot \sqrt{\in} \approx 816.$$

Accordingly, Equation (4) mentioned above is given as:

$$82 \leq L \leq 816 \quad (4)'$$

In setting 3 the width L, if set at 50 μm or 1000 μm, does not satisfy the condition of Equation (4)'. Due to this, the connection member 103, 109 and the interconnect layer 102, 112 are not matched in characteristic impedance, thus causing a problem of increasing signal reflection between them.

In setting 3 the width L, if set at 85 μm, 200 μm, 400 μm or 800 μm, satisfies the condition of Equation (4)'. In this case, the characteristic impedance on the connection member 103, 109 is matched to the characteristic impedance on the interconnect layer 102, 112. Thus, almost no signal reflection occurs between them.

In this case, the followings are provided:

$$(R \cdot r\sqrt{\in'})/(h \cdot \sqrt{\in}) \approx 163$$

$$(2 \cdot R \cdot r\sqrt{\in'})/(h \cdot \sqrt{\in}) \approx 327.$$

Consequently, Equation (5) mentioned above becomes as:

$$163 \leq L \leq 327 \quad (5)'$$

In setting 3 if the width L if set at such a value as satisfying the condition of Equation (5)', e.g. 200 μm, 250 μm or 300 μm, then the connection member 103, 109 and the interconnect layer 102, 112 are further matched in characteristic impedance, thus signal reflection is further reduced between them.

In setting 3, the following is given:
$(1.5 \cdot R \cdot r \cdot \sqrt{\in'})/(h \cdot \sqrt{\in}) \approx 245$. Accordingly, Equation (6) mentioned above becomes $$L = 245 \quad (6)'.$$

In setting 3 if the width L be set at 245 μm satisfying the condition of Equation (6)', the connection member 103, 109 and the interconnect layer 102, 112 are best matched in characteristic impedance. Thus eliminating signal reflection is minimized between them.

Where the connection distance h is set at 400 μm, the diameter R of the connection member is 200 μm, the diameter r is 400 μm, the specific dielectric constant ∈ is 7.5, and the specific dielectric constant ∈' is 4, then we obtain the following:

$$(R \cdot r\sqrt{\in'})/(2 \cdot h \cdot \sqrt{\in}) \approx 73$$

$$(5 \cdot R \cdot r\sqrt{\in'})/(h \cdot \sqrt{\in}) \approx 730.$$

Accordingly, Equation (4) is given as:

$$73 \leq L \leq 730 \quad (4)''.$$

In setting 3 the width L, if set at 50 μm or 1000 μm, does not satisfy the condition of Equation (4)''. If it is done, the connection member 103, 109 and the interconnect layer 102, 112 are not matched in characteristic impedance, causing a problem of increasing signal reflection between them.

In setting 3 the width L, if set at 75 μm, 150 μm or 700 μm, satisfies the condition of Equation (4)''. Accordingly, the connection member 103, 109 and the interconnect layer 102, 112 are matched in characteristic impedance. Thus, almost no signal reflection occurs between them.

Meanwhile, in this case the followings are provided:

$$(R \cdot r\sqrt{\in'})/(h \cdot \sqrt{\in}) \approx 146$$

$$(2 \cdot R \cdot r\sqrt{\in'})/(h \cdot \sqrt{\in}) \approx 292.$$

Consequently, Equation (5) becomes as:

$$146 \leq L \leq 292 \quad (5)''$$

Where in setting 3 the width L, if set at 150 μm or 250 μm satisfying the condition of Equation (5)'', the connection member 103, 109 and the interconnect layer 102, 112 are further matched in characteristic impedance. Signal reflection is further reduced between them.

Furthermore, in setting 3 the following is provided:

$$(1.5 \cdot R \cdot r\sqrt{\in'})/(h \cdot \sqrt{\in}) \approx 219.$$

Accordingly, Equation (6) becomes $$L = 219 \quad (6)''.$$

In setting 3 if the width L is set at 219 μm satisfying the condition of Equation (6)'', the connection member 103, 109 and the interconnect layer 102, 112 are best matched in characteristic impedance. Thus, signal reflection is minimized between them.

As described above, the provision of this embodiment structure makes possible characteristic impedance matching without forming extra connection members.

In this embodiment, signal connection members can be formed with a twice density per unit area as compared to the conventional structure having five or more ground connection members per one signal connection member. Thus, in this embodiment size reduction is feasible as compared to the conventional. Further, it is possible to fabricate a multi-level circuit substrate at low cost. Also, because the width L can be further reduced, mounting with high density is feasible.

Now a fourth preferred embodiment of the invention will be described with reference to FIG. 9.

This embodiment is basically similar to the structure of the first to third embodiments, and accordingly the same or similar parts are attached by the same reference characters.

This multi-level circuit substrate is provided with a layered body 101 as an example of an insulator. The layered body 101 is structured by integrating four levels of insulation layers 100A, 100B, 100C and 100D. The layered body 101 is provided at inside with an interconnect layer 102 and an interconnect layer 112. The interconnect layers 102, 112 are electrically connected to each other through a connection member 103, via land 106 and connection member 109. The via land 106 is one example of an intermediate interconnect layer. The interconnect layers 102, 112 are formed by a patterned conductive film in an interconnection form. The interconnect layers 102, 112 are respectively provided with connection lands 102a, 112a. The connection lands 102a, 112a are circular in plan, as shown in FIG. 1B. The connection land 102a, 112a is provided at a lower or top end of the connection member 103, 109, nearly concentrically to the connection member 103, 109. The connection land 102a, 112a is abutted against the lower or top end of the connection members 103, 109, thus being electrically connected with the connection member 103, 109. The connection land 102a, 112a has a diameter somewhat greater than a diameter R of the connection member 109.

The layered member 101 is internally provided with a ground layer 107 as one example of a second shield layer on a same plane as the via land 106. A gap 108 is provided between the ground layer 107 and the via land 106, for providing electrical connection between them. Ground layers 140 are provided as one example of a first shield layer on respective outermost layers of the layered body 101.

In this embodiment, where the connection member 103, 109 has a higher characteristic impedance than that of the interconnect layer 102, a relationship is given as follows:

$$r<m \quad (7)$$

where r: diameter of the via land 106 m: diameter of the interconnect layer 102, 112, specifically diameter of the connection land 102a, 112a.

Meanwhile, where the impedance of the connection member 103, 109 is lower than that of the interconnect layer 102, a relationship is given as follows:

$$r>m \quad (8)$$

Figure 9:
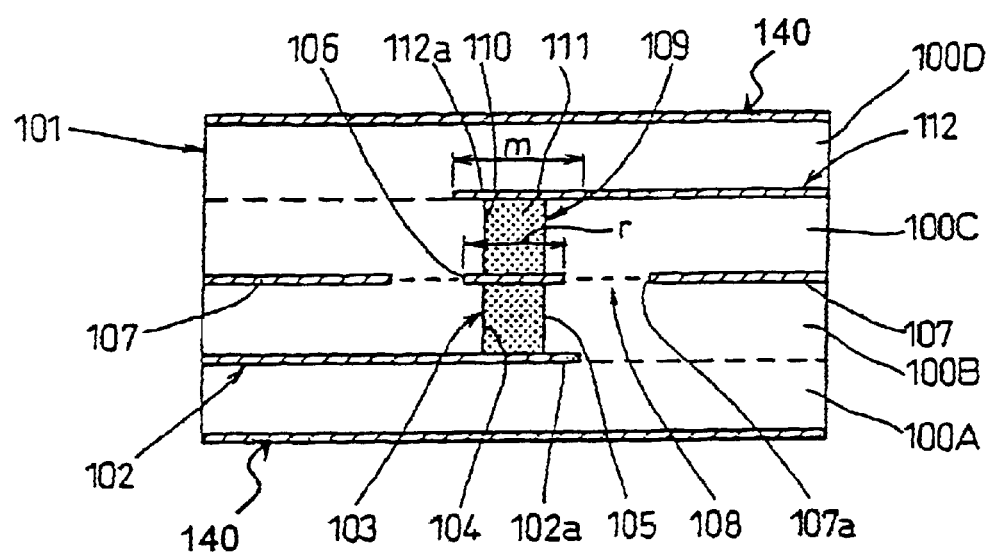
FIG. 9 is a sectional view showing a schematic structure of a multi-level circuit substrate according to a fourth preferred embodiment of the invention.

In FIG. 9 r>m is given as an example.

This provides matching of characteristic impedance between the connection member 103, 106 and the interconnect layer 102, 112, thereby reducing signal reflection. The reason is explained below.

The characteristic impedance Z of the connection member 103, 106 is expressed as $Z=\sqrt{(I/C)}$ by its equivalent inductance I and equivalent capacitance C. The equivalent inductance I is an inductance component resulting from a corresponding length of the connection member 103, 106 to a connection distance h described in the above embodiments. The equivalent capacitance C results from a capacitance existing between the connection member 103, 106 and the ground layer 140.

Here, the equivalent capacitance varies depending upon a difference between the diameter r of the via land and the diameter m of the connection land 102a, 112a. If the diameter r is increased greater than the diameter m (r>m), the capacitance C will be increased by an amount of $$\in \cdot \in_0 \cdot [\{\pi \cdot (m/2)\}^2 - \pi \cdot (r/2)^2]/(h/2).$$

Similarly, if the diameter r is decreased smaller than the diameter m (r<m), the capacitance C will be decreased by an amount of $$\in \cdot \in_0 \cdot [\{\pi \cdot (r/2)\}^2 - \pi \cdot (m/2)^2]/(h/2),$$

where

∈: specific dielectric constant of the insulation layer 100A–100D

$\in_0$: specific dielectric constant in vacuum h/2: distance between the connection member 103, 106 and the connection land 102a, 112a wherein a half (h/2) of the connection distance h is given because of equivalency of thickness of the insulation layers 100A–100D.

In this manner, the capacitance C can be increased by increasing the diameter m greater than the diameter r. Similarly, the capacitance C can be decreased by decreasing the diameter m smaller than the diameter r.

In the case that the impedance of the entire connection members is higher than that of the interconnect layers 102, 112, it is possible to reduce signal reflection by providing the diameter m greater than the diameter r and thereby matching their impedances. Where the entire connections is lower than that of the interconnect layers 102, 112, signal reflection can be reduced by providing the diameter m smaller than the diameter r to give matching between their impedances.

Figure 10:
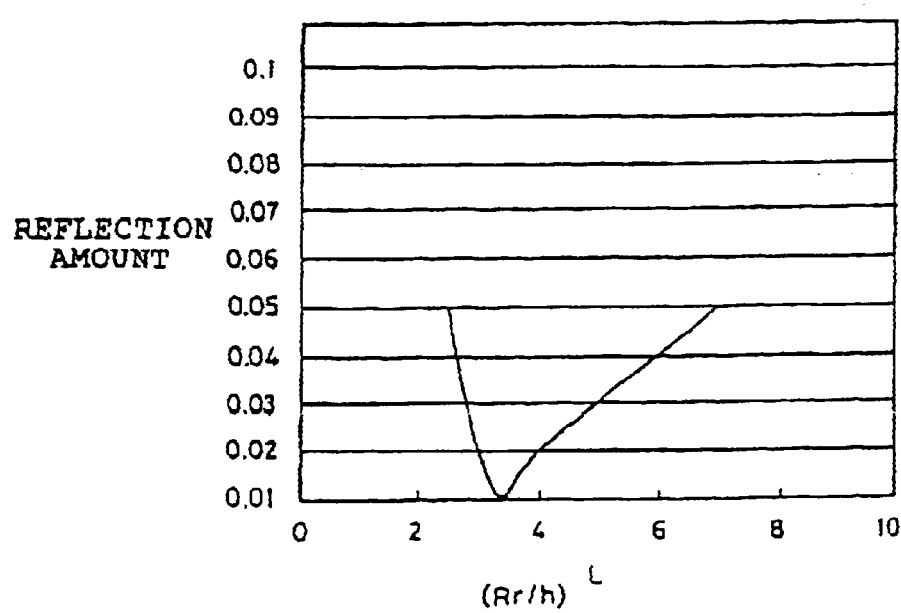
FIG. 10 is a graph showing a relationship of a signal reflectivity and a gap L in the fourth embodiment.

Referring to FIG. 10, shown is a reflection amount characteristic against a width L of the gap 108 for a case of a connection distance h=44.5 μm, diameter r=400 μm, diameter R=200 μm and diameter m=500 μm (r<m). As will be clear from comparison between FIG. 10 and FIG. 2, the range the reflection amount is suppressed lower than the upper limit value 0.05 shown in the before-described embodiment is broadened in range of a width L for the case of (r<m), as compared to a case of not doing so. Specifically, the range is broadened on a side increasing the width L.

Figure 11:
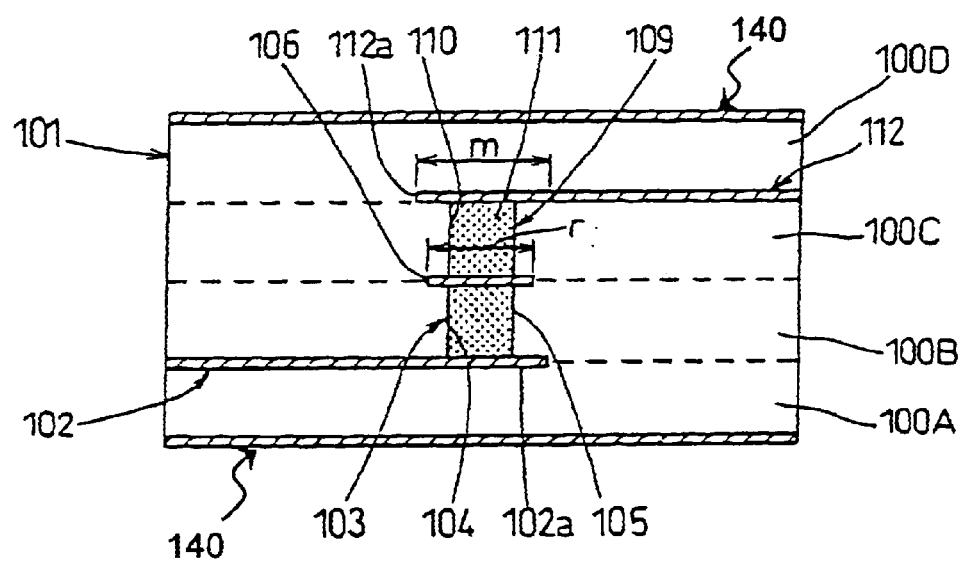
FIG. 11 is a sectional view showing a modification to the fourth embodiment.

This embodiment, if implemented for a multi-level circuit substrate without having a ground layer 107 as a second shield layer, provides for a similar effect as shown in FIG. 11. In the multi-level circuit board of FIG. 11, the width L of the gap 108 existed in the before-described embodiments is infinite, and accordingly the characteristic impedance is impossible to control by adjusting the width L. In order to control the characteristic impedance over the entire connection members in a manner matched to the characteristic impedance on the interconnect layers 102, 112, adjustment may be made on the relationship between the diameter r and the diameter m, as in this embodiment.

The embodiments having the above structure and feature provide for especial effects for cases of transmitting a signal with a wavelength of 1500 times the connection distance h. The reasons thereof are described hereinbelow.

Figure 12:
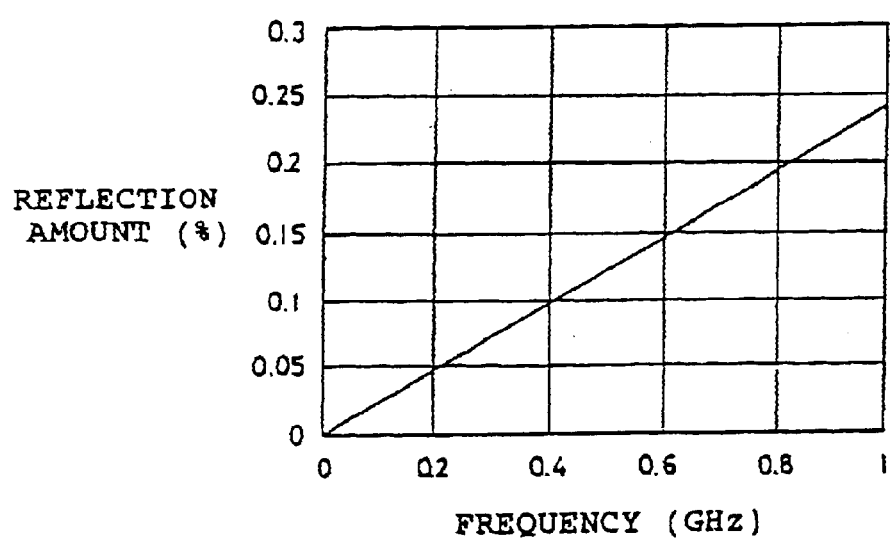
FIG. 12 is a graph showing a relationship between a frequency and a refection amount.

In a medium of specific dielectric constant ∈=1, if an interconnection having a length of 1 mm is formed on a substrate having no ground surface, the signal through the interconnection will have a characteristic of an amount of reflection depending upon a signal frequency as shown in FIG. 12. Here, provided that an upper limit value of the signal reflection amount is taken 5% as stated before, an upper limit of the frequency concerning the signal reflection amount is determined, i.e. the upper limit value is 0.2 GHz (=200 MHz). This if converted into a wavelength is 1.5 m.

If the wavelength (1.5 m in the above example) of the signal to be transmitted be less than 1/1500 of the interconnection length (1 mm in the above example), the reflection of signal due to the interconnection exceeds the upper limit value (5%) thus requiring control of characteristic impedance on the interconnection. Consequently, this embodiment provides for especial effects for cases of transmitting a signal with a wavelength of 1500 times the connection distance h.

Incidentally, the wavelength λ of an electromagnetic wave in a medium in general is expressed as:

$$\lambda = Cv/(f \cdot \sqrt{\in})$$

where

Cv: light velocity f: frequency.

Because the insulation layers 100A–100D of the embodiments correspond to mediums have a specific dielectric constant ∈ greater than 1, the transmission signal have a wavelength shorter than that of the case for the condition (∈=1) stated before. However, it is needless to say that a relationship between a connection distance h and a wavelength stands similarly to the above condition.

Incidentally, although in the embodiments the invention was explained on the multi-level circuit substrate having a ground layer as one example of a shield layer, the similar effect is obtainable by applying the invention to a multi-level circuit substrate having a power source layer as a shield layer. Furthermore, the similar effect is also obtainable if the invention is applied to a multi-level circuit substrate having both ground and power source layers.

Furthermore, it is needless to say that the invention can be similarly practiced in multi-level circuit substrates shown in FIG. 13A–FIG. 13F. FIG. 13A is a multi-level circuit substrate having five levels of insulation layers 100A–100E having at inside connection members 150A–150C stacked through three levels, via lands 106A, 106B of two layers, ground layers (or power source layers) 107A, 107B of two layers, and interconnect layers 102, 112, with ground layers 151 (or power source layers) provided on surfaces of outermost insulation layers 100A, 100E. The present invention can be practiced on such a multi-level circuit substrate.

FIG. 13B is a multi-level circuit substrate having three levels of insulation layers 100A–100C having at inside connection members 150A–150C stacked through three levels, via lands 106A, and 106B of two layers, ground layers (or power source layers) 107A, 107B of two layers, with interconnect layers 102, 112 provided on surfaces of outermost insulation layers 100A, 100C. The present invention can be practiced on such a multi-level circuit substrate.

FIG. 13C is a multi-level circuit substrate having three levels of insulation layers 100A–100C having at inside connection members 150A, 150B stacked through two levels, one via land 106, a ground layer (or power source layer) 107 of one layer, and one interconnect layer 102, wherein a ground layer 151 is provided on a surface of an outermost insulation layer 100A and the other interconnect layer 112 on a surface of an outermost insulation layer 100B. The present invention can be practiced on such a multi-level circuit substrate.

FIG. 13D is a multi-level circuit substrate having five levels of insulation layers 100A–100E having at inside connection members 150A–150C stacked through three levels, via lands 106A, 106B of two layers, a ground layer (or power source layer) 107 of one layer, and interconnect layers 102, 112 wherein ground layers 151 are provided on surfaces of outermost insulation layers 100A, 100E. The present invention can be practiced on such a multi-level circuit substrate.

FIG. 13E is a multi-level circuit substrate having three levels of insulation layers 100A–100C having at inside connection members 150A–150C stacked through three levels, via lands 106A, 106B of two layers, and a ground layer (or power source layer) 107 of one layer, wherein interconnect layers 102, 112 are provided surfaces of outermost insulation layers 100A, 100C. The present invention can be practiced on such a multi-level circuit substrate.

FIG. 13F is a multi-level circuit substrate having multiple levels of insulation layers having outermost five insulation layers 100A–100E having at inside connection members 150A–150C stacked through three levels, via lands 106A, 106B of two layers, and two ground layers 107A, 107B (or power source layers), wherein interconnect layers 102, 112 are provided and a ground layer 151 (or power source layer) is provided on a surface of an outermost insulation layer 100A. The present invention can be practiced on such a multi-level circuit substrate.

Although the invention was explained in detail on best preferred embodiments, the combination and arrangement of parts of the preferred embodiments are to be modified in various forms without departing from the spirit of the invention as hereinafter claimed.

What is claimed is:

1. A multi-level circuit substrate comprising:
   upper and lower parallel non-aligned interconnect layers respectively extending inwardly horizontally from opposite sides of the substrate and having an end termination at a central location in the substrate;
   insulation provided between the two interconnect layers;
   at least two vertically aligned conductors each respectively extending perpendicularly from one of the interconnect layers through the insulation and each having an inner end centrally of the substrate;
   an intermediate connection layer in a horizontal plane sandwiched between and in contact with the inner ends of the aligned conductors so as to provide an electrical connection between the upper and lower non-aligned interconnect layers;
   a shield layer provided in approximately the same horizontal plane as the intermediate connection layer and surroundingly spaced from and around the intermediate connection layer; and
   wherein a condition of $(R \cdot r)/(2 \cdot h) \leq L \leq (5 \cdot R \cdot r)/h$ is satisfied, provided that a connection distance between the interconnect layers through the aligned conductors and the intermediate connection layer is h, the aligned conductors are circular cylinders having a diameter R, the intermediate connection layer has a circular periphery portion having a diameter r, and a spaced distance between the intermediate connection layer and the shield layer is L.

2. A multi-level circuit substrate according to claim 1, wherein the insulation comprises stacked layers including a lower or first insulation layer, a second insulation layer stacked on top of the lower insulation layer, a third insulation layer stacked on the second insulation layer and a fourth or top insulation layer stacked on the third insulation layer and, wherein the shield layer is sandwiched between the second insulation layer and the third insulation layer; and
   wherein the aligned conductors comprise a lower conductor electrically connecting the lower interconnect layer and the intermediate connection layer and an upper conductor electrically connecting the intermediate connection layer to the upper interconnect layer.

3. A multi-level circuit substrate according to claim 1, wherein the shield layer is a ground layer.

4. A multi-level circuit substrate according to claim 1, wherein the shield layer is a power source layer.

5. A multi-level circuit substrate according to claim 1, wherein the multi-level circuit substrate transmits a signal having a wavelength shorter than 1500 times the connection distance h.

6. A multi-level circuit substrate comprising:
   upper and lower interconnect layers vertically spaced relative to each other;
   a first insulator provided between the upper and lower interconnect layers;
   upper and lower conductors provided in the insulation material between the interconnect layers with the upper connection member contacting the upper interconnect layer and the lower connection member contacting the lower interconnect layer;
   an intermediate connection layer sandwiched between and contacting the upper and lower conductors so as to complete an electrical connection between the interconnect layers;
   a shield layer provided in alignment with and surrounding the intermediate connection layer and placed while being spaced from the intermediate connection layer by a gap; and
   a second insulator having a lower specific dielectric constant than the first insulator positioned in the gap between the shield layer and the intermediate connection layer.

7. A multi-level circuit substrate according to claim 6, wherein a condition of $(R \cdot r \cdot \sqrt{\in'})/(2 \cdot h \cdot \sqrt{\in}) \leq L \leq (5 \cdot R \cdot r \cdot \sqrt{\in'})/(h \cdot \sqrt{\in})$ is satisfied, provided that the specific dielectric constant of the first insulator is $\in$, the specific dielectric constant of the second insulator is $\in'$, the connection distance between the interconnect layers through the connection members and the intermediate connection layer is h, the upper and lower conductors are generally formed as a circular cylinder having a diameter R, the intermediate connection layer is generally circular having a diameter r, and the spaced distance between the intermediate connection layer and the shield layer is L.

8. A multi-level circuit substrate according to claim 6, wherein the first insulator is formed of lower and upper stacked upper and lower insulation layers;

the intermediate connection layer and the shield layer are sandwiched between the lower insulation layer and the upper insulation layer; and wherein the connection members comprise a lower connection member provided in the lower insulation layer and electrically connecting the lower interconnect layer and the intermediate connection layer; and an upper connection member provided in the upper insulation layer and electrically connecting the upper interconnect layer and the intermediate connection layer.

9. A multi-level circuit substrate according to claim 6, wherein the shield layer is a ground layer.

10. A multi-level circuit substrate according to claim 6, wherein the shield layer is a power source layer.

11. A multi-level circuit substrate according to claim 6, wherein the multi-level circuit substrate transmits a signal having a wavelength shorter than 1500 times the connection distance between the interconnect layers through the upper and lower conductors and the intermediate connection layer.

12. A multi-level substrate as recited in claim 1, wherein the intermediate connection layer has a circular peripheral surface.

13. A multi-level substrate as recited in claim 12, wherein the end termination of the upper interconnect layer and the lower interconnect layer each include a connection land that is generally circular in plan and positioned to contact a respective one of the aligned conductors and an outwardly extending arm having parallel edges.

14. A multi-layer substrate as recited in claim 12, wherein the shield layer has a circular cut-out defined by a circular surface spaced from and surrounding the intermediate connection layer.

15. A multi-level circuit substrate comprising:

mutually opposing connection lands provided inward of the substrate;

at least a pair of non-aligned interconnect layers comprising upper and lower interconnect layers provided inward of the substrate and being respectively connected to the connection lands;

insulators provided between the upper and lower interconnect layers;

at least two substantially cylindrical connection members aligned on a line that passes through the insulators and are each respectively electrically connected with a respective one of the connection lands;

a substantially circular intermediate connection layer oriented in a plane sandwiched between the connection members to electrically connect the connection members;

a shield layer provided in approximately the same plane as the intermediate connection layer and surroundingly spaced from and around the intermediate connection layer; and wherein a condition of $(R \cdot r)/(2 \cdot h) \leq L \leq (5 \cdot R \cdot r)/h$ is satisfied, provided that a connection distance between the interconnect layers through the interconnect layers and the intermediate connection layer is h, a diameter of the substantially cylindrical connection members is R, a diameter of the substantially circular intermediate connection layer is r, and a spaced distance between the intermediate connection layer and the shield layer is L.

16. A multi-level circuit substrate according to claim 15, wherein the insulation comprises stacked layers including a lower or first insulation layer, a second insulation layer stacked on top of the lower insulation layer, a third insulation layer stacked on the second insulation layer and a fourth or top insulation layer stacked on the third insulation layer and, wherein the shield layer is sandwiched between the second insulation layer and the third insulation layer; and wherein the aligned conductors comprise a lower conductor electrically connecting the lower interconnect layer and the intermediate connection layer and an upper conductor electrically connecting the intermediate connection layer to the upper interconnect layer.

17. A multi-level circuit substrate according to claim 15, wherein the shield layer is a ground layer.

18. A multi-level circuit substrate according to claim 15, wherein the shield layer is a power source layer.

19. A multi-level circuit substrate according to claim 15, wherein the multi-level circuit substrate transmits a signal having a wavelength shorter than 1500 times the connection distance h.

* * * * *